(12) United States Patent
Li et al.

(10) Patent No.: US 10,910,327 B2
(45) Date of Patent: Feb. 2, 2021

(54) ELECTRONIC DEVICE PACKAGE WITH REDUCED THICKNESS VARIATION

(71) Applicant: Intel Corporation, Santa Clara, CA (US)

(72) Inventors: Yonggang Li, Chandler, AZ (US); Brandon C Marin, Chandler, AZ (US); Vahidreza Parichehreh, Gilbert, AZ (US); Jeremy D Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/369,681

(22) Filed: Mar. 29, 2019

(65) Prior Publication Data

US 2020/0312787 A1 Oct. 1, 2020

(51) Int. Cl.
| | |
|---|---|
| *H01L 23/495* | (2006.01) |
| *H01L 23/00* | (2006.01) |
| *H01L 23/498* | (2006.01) |
| *H01L 23/14* | (2006.01) |
| *H01L 21/48* | (2006.01) |

(52) U.S. Cl.
CPC ........ *H01L 23/562* (2013.01); *H01L 21/4853* (2013.01); *H01L 21/4857* (2013.01); *H01L 23/145* (2013.01); *H01L 23/49816* (2013.01); *H01L 24/16* (2013.01); *H01L 2224/16225* (2013.01); *H01L 2924/3511* (2013.01)

(58) Field of Classification Search
CPC ............... H01L 23/638; H01L 23/5389; H01L 23/5385; H01L 23/49816; H01L 21/4857; H01L 21/4853
See application file for complete search history.

(56) References Cited

U.S. PATENT DOCUMENTS

| | | | |
|---|---|---|---|
| 2012/0074582 A1* | 3/2012 | Yu ..................... | H01L 21/76831 257/774 |
| 2016/0211190 A1* | 7/2016 | Braunisch ............... | H05K 1/021 |
| 2017/0204279 A1* | 7/2017 | Larimer ............... | C09D 109/04 |
| 2018/0097158 A1* | 4/2018 | Estrada ................. | H01L 33/505 |
| 2018/0342456 A1* | 11/2018 | Cheng ................. | H01L 23/5389 |
| 2019/0002275 A1* | 1/2019 | Chang ..................... | B81B 7/007 |
| 2020/0075546 A1* | 3/2020 | Shih ....................... | H01L 21/56 |

OTHER PUBLICATIONS

So Peter TC, "Two-photon Fluorescence Light Microscopy", Encyclopedia of Life Sciences, (2002), 5 pgs.

* cited by examiner

*Primary Examiner* — Phuc T Dang
(74) *Attorney, Agent, or Firm* — Schwegman Lundberg & Woessner, P.A.

(57) ABSTRACT

A package for an electronic device may include a first layer. The first layer may include a first dielectric material. The first layer may have a planar first surface. The first layer may have a variable thickness. A second layer may be coupled to the first layer. The second layer may include a second dielectric material and may have a planar second surface. The second layer may have a variable thickness. A seam may be located at an interface between the first layer and the second layer, and the seam may have an undulating profile. The package may include at least one electrical trace, for example located in the first layer or the second layer.

22 Claims, 7 Drawing Sheets

ELECTRONIC DEVICE PACKAGE WITH REDUCED THICKNESS VARIATION

TECHNICAL FIELD

This document pertains generally, but not by way of limitation, to a package for an electronic device.

BACKGROUND

An electronic device may include a package. The package may transmit an electrical signal between one or more components of the electronic device. For instance, a die (e.g., a semiconductor die) may be coupled to the package. The package may help transmit electrical signals to components of the die (e.g., between a first transistor or a second transistor) or to other components of the electronic device (e.g., memory, a motherboard, additional die, or the like). The package may include a plurality of layers. An individual layer of the plurality of layers may have a variation in thickness, for example a first (e.g., minimum) thickness and a second (e.g., maximum thickness).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
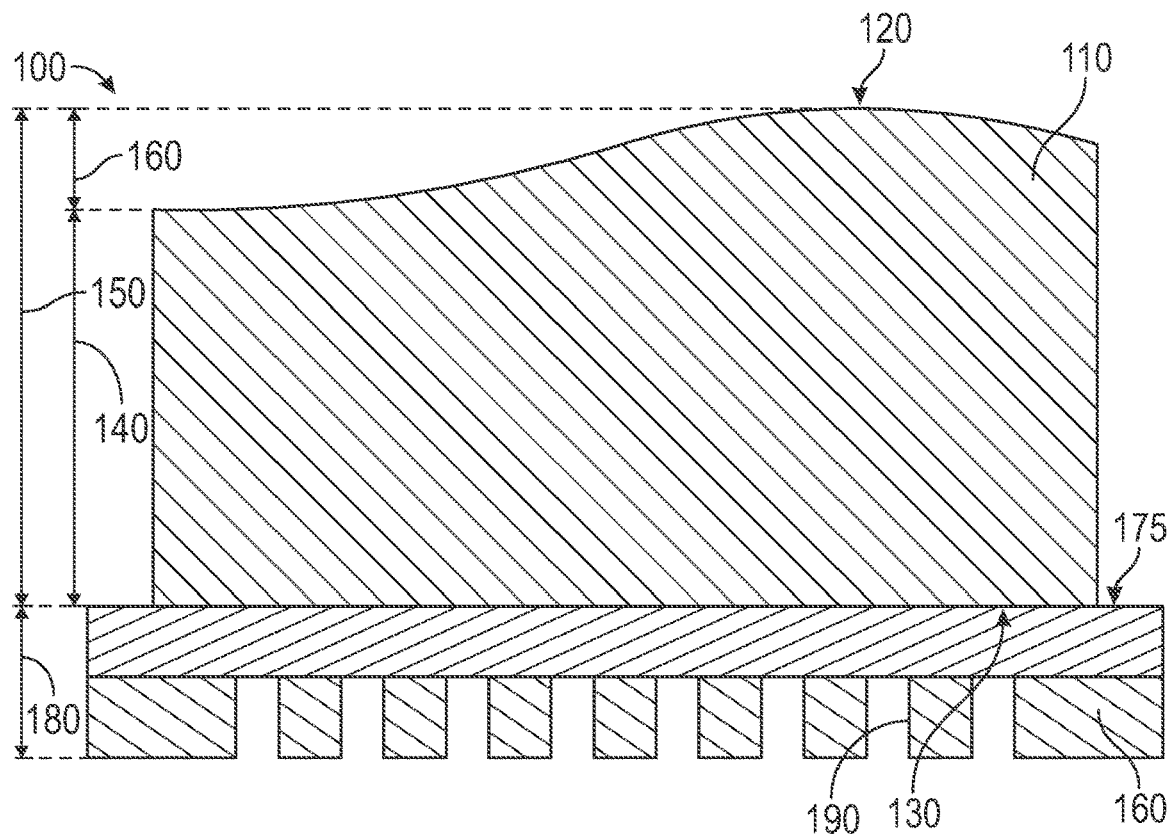
FIG. 1 shows an example of a portion of a first package during a manufacturing operation.

The present inventors have recognized, among other things, that a problem to be solved may include a patterning technique to effectively flatten a surface of, or planarize, a package, wherein a thickness of the package varies along one or more dimensions of the package. For instance, the package may have a first (e.g., minimum) thickness and a second (e.g., maximum thickness). The thickness of the package may vary between the first and second thicknesses (e.g., the package may include a plurality of thicknesses).

The variation in thickness of the package may make planarizing (e.g., flattening, smoothing, or the like) the package difficult. The variation in thickness of the package may increase variations in thickness of interconnects that are coupled to the package. For example, the package 100 may include interconnects (e.g., pillars, bumps, or the like) that project from a surface of the package.

Planarizing the package may remove portions of the package. Planarizing the package may remove portions of the interconnects. In some examples, planarizing a package with thickness variations may result in over-planarizing portions of the package (e.g., by removing too much, or all of, an individual interconnect) or under-planarizing portions of the package (e.g., by removing too little of an individual interconnect). Over-planarizing and under-planarizing may be undesirable because it may increase the difficulty in connecting an electronic component (e.g., a die) with the package. For example, an open circuit may be present between a die coupled to the package (e.g., the die may not be coupled to one or more of the interconnects).

The present subject matter may help provide a solution to these problems, such as by providing a package with low total thickness variation for an electronic device. The package may include a first layer, and the first layer may include a first dielectric material. The first layer may have a planar first surface. The first layer may have a variable thickness. A second layer may be coupled to the first layer. The second layer may include a second dielectric material and may have a planar second surface. The second layer may have a variable thickness. A seam may be located at an interface between the first layer and the second layer, and the seam may have an undulating profile. The package may include at least one electrical trace, for example located in the first layer or the second layer.

The planarized surfaces of the package may reduce the total thickness variation of the package. The planarized surfaces of the package may help facilitate coupling the package with additional components, for instance a die (e.g., a semiconductor die), memory, motherboard, or the like. For example, the planarized surfaces of the package may reduce the occurrence of electrical faults (e.g., open circuits) between the package and other components. The planarized surface of the package may improve manufacturing yields for the electronic device, for example by helping to decrease the occurrence of electrical faults between the package and other components of the electronic device. The planarized surfaces of the package may reduce electrical faults within the package, for example by improving the coupling between components of the package. For instance, an electrical trace may be included in a first layer of the package, and the trace may be coupled to a via that may be included in a second layer of the package. Planarizing a surface of the first layer may reduce the occurrence of electrical faults between the trace and the via. Additionally or alternatively, the planarized surfaces may decrease the occurrence of decoupling between components of the package. For example, planarizing a surface of a first layer of the package may prevent decoupling (e.g., delamination, separation, or the like) of a second layer from the first layer.

This overview is intended to provide an overview of subject matter of the present patent application. It is not intended to provide an exclusive or exhaustive explanation of the invention. The detailed description continues, and is included to provide further information about the present patent application.

FIG. 1 shows an example of a portion of a first package 100 during a manufacturing operation. The package 100 may include a first layer 110, and the first layer 110 may include a first dielectric material. For example, the first dielectric material may include (but is not limited to) oxirane epoxy, phenolate esters, phenolic esters, or a combination thereof. The first dielectric material (e.g., a polymeric material) may be less electrically conductive than a conductive material (e.g., copper).

The first layer 110 may include a first surface 120 and a second surface 130. The second surface 130 may be opposite to the first surface 120. The first layer 110 may have a variable thickness. For example, a dimension between the first surface 120 and the second surface may not be constant. For instance, the first layer 110 may include a first thickness 140 (e.g., a minimum thickness) and a second thickness 150 (e.g., a maximum thickness). For example, the thickness (e.g., the second thickness 150) of the first layer may be within a range of approximately 100 nanometers to 2500 micrometers (e.g., 100 nanometers to 500 nanometers, 400 nanometers to 1 micrometer, 10 micrometers to 30 micrometers, or the like). The first layer 110 may include a plurality of thicknesses along a dimension (e.g., a width, length, depth, or the like) of the first layer 110. For example, the thickness of the first layer 110 may vary (e.g., transition, oscillate, rise and fall, or the like) between the first thickness 140 and the second thickness 150.

The first layer 110 may have a layer thickness variation 160. The layer thickness variation 160 may be the difference between the second thickness 150 and the first thickness 140. The layer thickness variation 160 may be 0.000001 percent to 5 percent of a total thickness of the first layer 110 (e.g., the second thickness 150). For example, the layer thickness variation 160 may be within a range of 50 nanometers to 1 millimeter (e.g., 50 nanometers to 100 nanometers, 125 nanometers to 1 micrometer, 1 micrometer to 10 micrometers, or the like). However, the present subject matter is not so limited (e.g., the layer thickness variation 160 may be less than 50 nanometers or greater than 1 millimeter).

FIG. 1 shows that the second surface 130 of the first layer 110 may be mated to (e.g., coupled to, resting upon, abutted against, placed upon, or the like) a foundation 170. The foundation 170 may include a foundation surface 170. The foundation surface 175 may be planar (e.g., flat, smooth, uniform, or the like). For example, a foundation thickness 180 may vary less than the layer thickness variation 160 of the first layer 110. For example, the variation in the foundation thickness 180 may be within a range of approximately 0.000001 percent to 0.0001 percent of the foundation thickness 180. The variation in the foundation thickness 180 may be less than 0.000001 percent of the foundation thickness 180. The variation in the foundation thickness 180 may be within a range of approximately 10 nanometers to 50 nanometers (e.g., 10 nanometers to 15 nanometers, 12 nanometers to 24 nanometers, 20 nanometers to 40 nanometers, or the like). The foundation 170 may include a vacuum port 190, and the vacuum port 190 may be in communication with the foundation surface 175.

A force may be applied to the package 100 while mated to the foundation 160, and the second surface 130 of the first layer 110 may become planar in response to the force applied to the package 100. For example, gravity may act upon the package 100, and the second surface 130 may become planar in response to the force of gravity. Alternatively or additionally, a vacuum may be applied to the vacuum port 190, and the vacuum may be applied to the second surface 130, and the vacuum may make the second surface 130 planar.

When the second surface 130 of the first layer 110 is planar, the thickness variation 160 of the first layer 110 may be transferred (e.g., transposed, translated, relocated, or the like) to the first surface 120 of the first layer 110. Accordingly, the first layer 110 may have an undulating profile (e.g., oscillating, wave-like, nonuniform, rough, or the like). The second surface 130 may be planar in comparison the undulating profile of the first surface 120.

Figure 2:
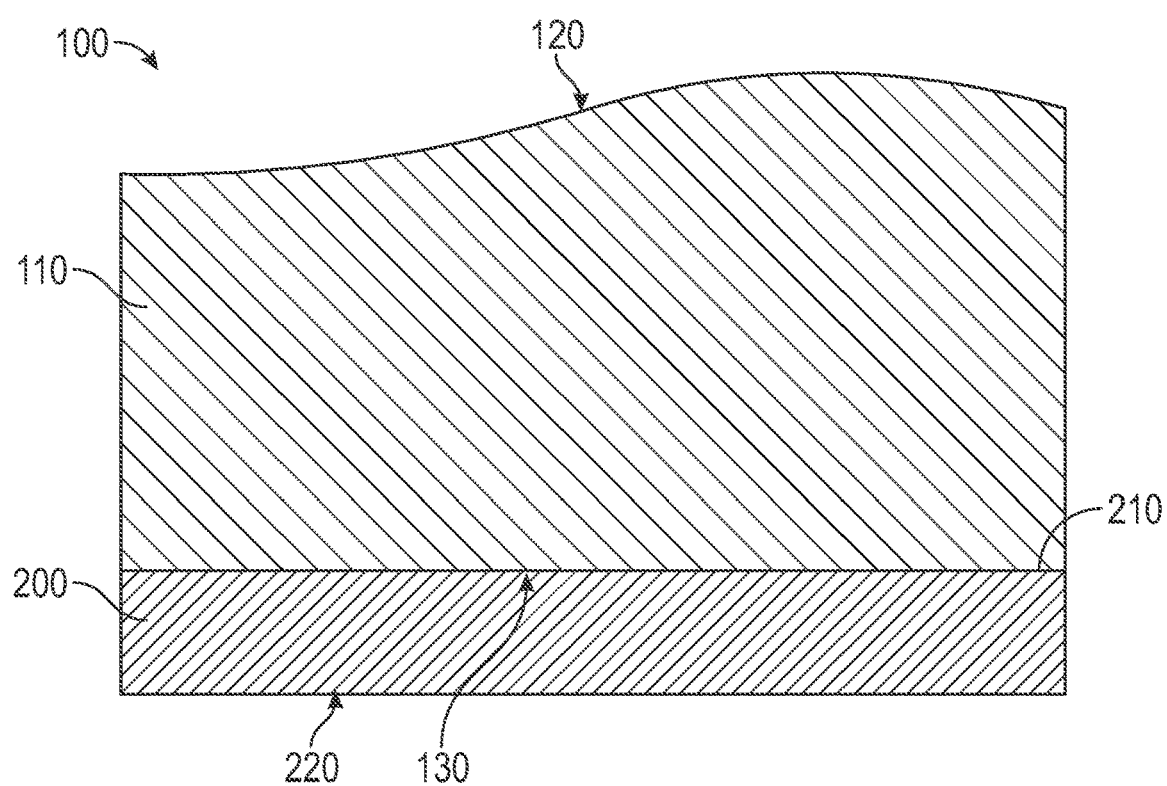
FIG. 2 shows the first package of FIG. 1 during a manufacturing operation.

FIG. 2 shows the first package 100 of FIG. 1 during a manufacturing operation. The package 100 may include a second layer 200. The second layer 200 may include a second dielectric material. For example, the second layer 200 may include acrylates, formaldehydes (e.g., novolaks, or the like), benzoquinones, diazoquinones, or the like (or combinations thereof). In some examples, the second layer 200 may include chalocogenides (e.g., Cadmium Selenide, Zinc Sulfide, Copper Sulfide, Zinc Selenide, Cadmium Sulfide, Aluminum Selenide, or the like, or combinations thereof) The second layer may include diazobenzoquinone, diazonapthalenequinone, or diazoalkylquinone.

The second layer 200 may include a photoresist, such as a positive photoresist or a negative photoresist. For instance, the second dielectric material may more soluble, or less soluble, with respect to a developer (e.g., 1-methoxy-2-propanol acetate, cyclopentanone, or the like) when the second dielectric material is exposed to a light source (e.g., a laser).

The second layer 200 may be coupled with the first layer 110. For instance, the second layer 200 may be coupled to the second surface 130 of the first layer 110. A first seam 210 may be located at an interface of the first layer 110 and the second layer 200. The seam 210 may have an undulating profile, for example because the second surface 130 of the first layer 110 may have an undulating profile.

The seam 210 may be detectable by cross-sectioning (e.g., cutting, sawing, ablating, or the like) the package 100. For example, the seam 210 may be detectable because the second layer 200 and the first layer 110 may be manufactured in separate manufacturing operations. For instance, a discontinuity in the physical structure of the first layer 110 or the second layer 200 may be observable (e.g., with non-destructive evaluation, such as an x-ray operation). The seam 210 may be detectable because the first dielectric material (optionally included in the first layer 110) may be a different material than the second dielectric material (optionally included in the second layer 200).

The second layer 200 may include a second layer surface 220. The second layer surface 220 may be located opposite to the first surface 120 of the first layer 100. FIG. 2 shows the second surface 130 of the first layer 110 and the second layer surface 220 as planar, however the present subject matter is not so limited (e.g., the second layer surface 220 may have an undulating surface, similar to the first surface 120 of the first layer 110).

Figure 3:
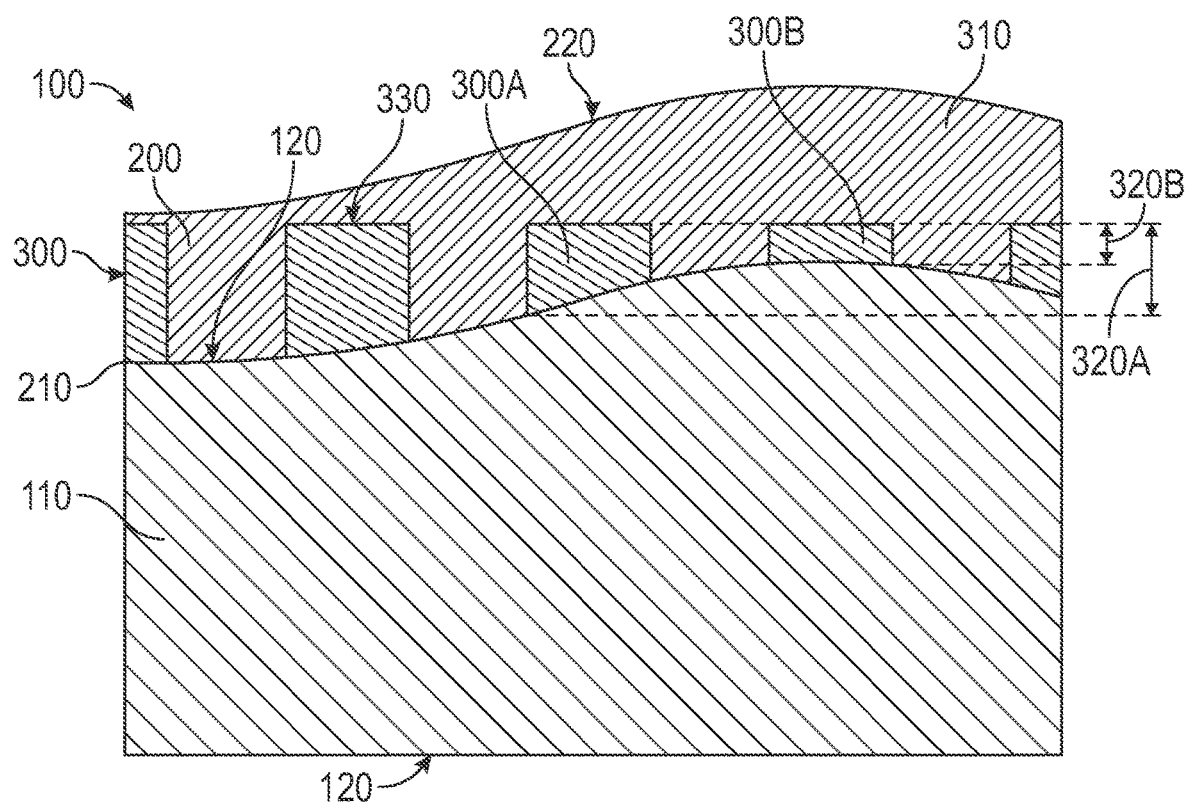
FIG. 3 shows the first package of FIG. 1 during a manufacturing operation.

FIG. 3 shows the first package 100 of FIG. 1 during a manufacturing operation. As described herein, the second layer 200 may include the second dielectric material, and the second dielectric material may be a photoresist. The second layer 200 may include one or more photo-exposed portions 300, for instance a first photo-exposed portion 300A and a second photo-exposed portion 300B. The photo-exposed portions 300 may be exposed to a light source. The second layer 200 may include unexposed portions 310, and the unexposed portions 310 may not be exposed to a light source.

The photo-exposed portions 300A,300B may be cured (e.g., polymerized, crosslinked, less soluble to a developer, or the like) or solubilized (e.g., decomposed, softened, weakened, degraded, become more soluble to a developer, or the like) when exposed to a light source. The unexposed portions 310 may remain coupled to the first layer 100 if the second layer 100 includes a positive photoresist and the photo-exposed portions 300 may be removed with a developer. The unexposed portions 310 may remain coupled to the first layer 100 if the second layer 100 includes a positive photoresist. The photo-exposed portions 300 may remain coupled to the first layer 100 if the second layer 100 includes a negative photoresist and the unexposed portions 310 may be removed with a developer. The photo-exposed portions 300 may remain coupled to the first layer 100 if the second layer 100 includes a negative photoresist.

As described herein, the second layer 220 may be exposed to a light source. For example, the second layer may be exposed to a single photon polymerization operation. The light source may cure (or solubilize) the second layer 200 (e.g., the second dielectric material) by supplying energy to the second layer 200. The energy supplied by the light source may exceed an activation energy threshold to cure (or solubilize) the second layer 200. Exposure of the second layer 200 to the light source may cure (or solubilize) the second layer 200 through the entire thickness of the second layer 200 (e.g., the light source may cure the second layer 200 from the second layer surface 220 to the second surface 130 of the first layer 110).

The second layer 220 may be exposed to a plurality of light sources. For example, the second layer 220 may be exposed to a multi-photon polymerization operation. The second layer 220 may be exposed to a first laser and a second laser. The first laser and the second laser may coincide (e.g., converge, combine, or the like) at a voxel and the combined energy of the first laser and the second lasers may exceed an activation energy threshold to cure (or solubilize) the second layer 200.

The multi-photon polymerization operation may increase the resolution of curing (or decomposing) the second layer 200. For example, exposure of the second layer 200 to the first laser and the second laser may cure (or solubilize) the second layer 200 only at the voxel. For instance, the voxel may be repositioned to cure (or solubilize) only a portion of the second layer 200, such as the photo-exposed portions 300. Accordingly, the photo-exposed portions 300 may be patterned to have a variety of geometries. For instance, the photo-exposed portions 300 may interface with the seam 230 and extend partially through the second layer 200. Alternatively or additionally, the photo-exposed portions 300 may be surrounded by (enclosed, encased, submerged within, or the like) the unexposed portions 310.

The multi-photon polymerization operation may help facilitate planarizing the package 100, for example by allowing the second layer 200 to have a variable thickness (e.g., height, dimension, or the like). For instance, the photo-exposed portion 300A may have a first thickness 320A, and the photo-exposed portion 300B may have a second thickness 320B. The variable thickness of the second layer 200 may allow for the second layer to compensate for the variable thickness of the first layer 110.

The photo-exposed portions 300 may include a surface 330. The surface 330 of the portion 300A may be coplanar with the surface 330 of the portion 300B. The surface 330 may be exposed when the unexposed portion 310 is removed (e.g., when the second layer 200 includes a negative photoresist). The surface 330 may be exposed when the photo-exposed portions 300 are removed (e.g., when the second layer 200 includes a positive photoresist).

Figure 4:
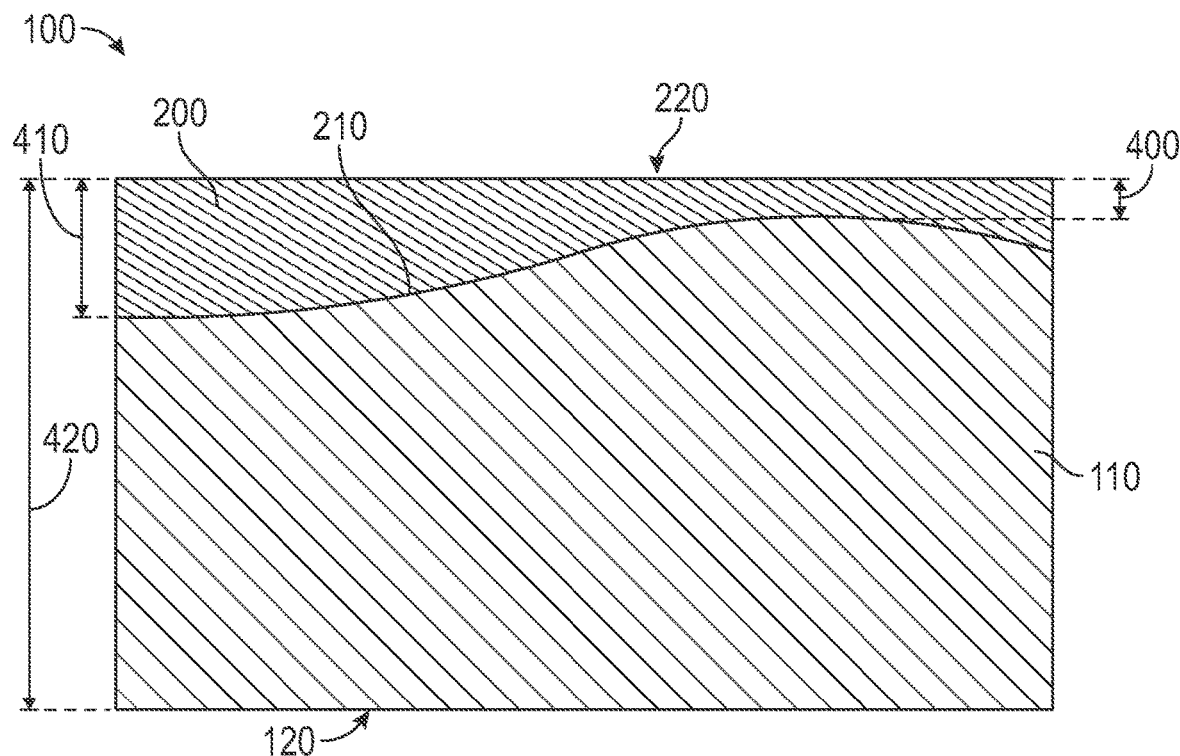
FIG. 4 shows the first package of FIG. 1 during a manufacturing operation.

FIG. 4 shows the first package 100 of FIG. 1 during a manufacturing operation. The second layer 200 may be coupled to the first layer 110 (e.g., at the seam 210. The second layer 200 may have a variable thickness. For example, a dimension between the second layer surface 220 and the seam 210 may not be constant. For instance, the second layer 200 may include a first thickness 400 (e.g., a minimum thickness) and a second thickness 410 (e.g., a maximum thickness). The second layer 200 may include a plurality of thicknesses along a dimension (e.g., a width, length, depth, or the like) of the second layer 200. For example, the thickness of the second layer 200 may vary (e.g., transition, oscillate, rise and fall, or the like) between the first thickness 400 and the second thickness 410. Accordingly, the second layer 200 may have an undulating profile, for example because the second surface 130 of the first layer 110 may have an undulating profile.

The second layer 200 may be cured (or solubilize) to planarize the second layer surface 220. For example, the variable thickness of the second layer 200 may compensate for the variable thickness of the first layer 110. For instance, the second layer 200 may be thinner (e.g., the second layer 200 has the first thickness 400) proximate to where the first layer 110 is thicker (e.g., the first layer 110 has the second thickness 150). The second layer 200 may be thicker (e.g., the second layer 200 has the second thickness 410) proximate to where the first layer 110 is thinner (e.g., the first layer 110 has the first thickness 140). Accordingly, the variable thickness of the second layer 200 may compensate for the variable thickness of the first layer 110, for example to planarize the second layer surface 220. Alternatively or additionally, a thickness variation of the package 100 (e.g., the dimension between the second layer surface 200 and the first surface 120 of the first layer 110) may be reduced because the variable thickness of the second layer 200 compensates for the variable thickness of the first layer 110.

The package 100 may have a package thickness 420. The package thickness 420 may be the dimension between first surface 120 of the first layer and the second layer surface 220 of the second layer 200. The variable thickness of the second layer 200 may compensate for the variable thickness of the first layer 110. Accordingly, the variable thicknesses of the layers 110, 200 may help facilitate making the package thickness 420 consistent (e.g., constant, minimal variation, or the like). For example, a variation in the package thickness 420 may be within a range of approximately 10 nanometers to 5,000 nanometers (e.g., 10 nanometers to 20 nanometers, 50 nanometers, 400 nanometers to 1,000 nanometers, or the like). The variation in the package thickness 420 may be less than 10 nanometers.

A total thickness variation of the package 100 may be the composite thickness variation of each individual layer, for example the layer 110, layer 200, the layer 710 (shown in FIG. 7), or additional layers. Configuring the second layer 200 to compensate for the variable thickness of the first layer 110 may help reduce the total thickness variation of the package 100. The package 100 may include a plurality of layers that compensate for a thickness variation in other layers. For example, a third layer (e.g., the layer 710, shown in FIG. 7) may compensate for the thickness variation of both the first layer 110 and the second layer 200.

Figure 5:
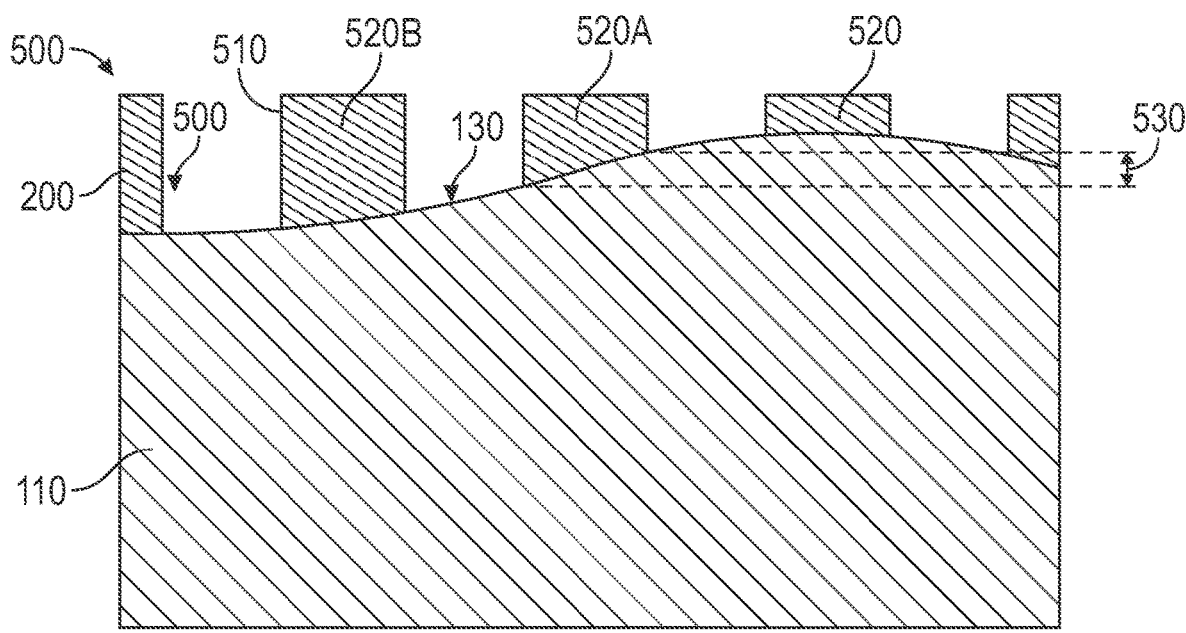
FIG. 5 shows an example of a portion of a second package during a manufacturing operation.

FIG. 5 shows an example of a portion of a second package 500 during a manufacturing operation. The second package 500 may be similar to the first package 100. For example, the second package 500 may include the first layer 110 and the second layer 200. The first layer 110 or the second layer 200 may define one or more cavities 500. For instance, the second layer 200 may include a cavity wall 510 that defines the cavity 500. The cavities 500 may extend to the first layer 110, for instance the cavities 500 may interface with the seam 210.

As described herein, the second layer 200 may have a variable thickness. The first layer 110 and the second layer 200 may have an undulating profile. The second layer 200 may include sections 520 with varying thicknesses, for instance a first section 520A and a second section 520B. For example, the first section 520A may have a thickness variation 530. The sections 520 may be contoured (e.g., curved, bending, or the like) to conform to the undulating profile of the first layer 110. Accordingly, the contoured sections 520 may provide the second layer 220 with the undulating profile.

Figure 6:
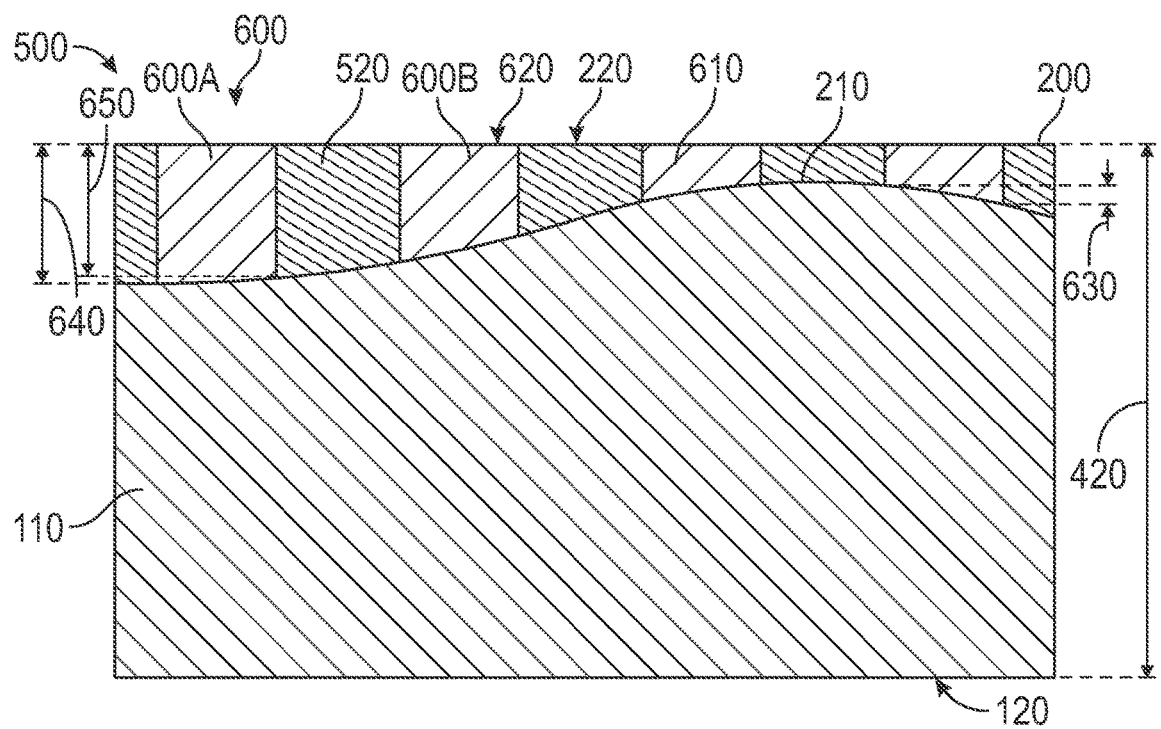
FIG. 6 shows the second package of FIG. 5 during a manufacturing operation.

FIG. 6 shows the second package 500 of FIG. 5 during a manufacturing operation. The package 500 may include a first set of interconnects 600, for instance a first interconnect 600A and a second interconnect 600B. The interconnects 600 may be included in the second layer 200. A conductive portion 610 (e.g., copper, gold, nickel, aluminum, or the like) may be coupled to the package 500 (e.g., electroplating, electroless plating, vapor deposition, or the like). The conductive portion 610 may be located in the cavities 500 (shown in FIG. 5). The conductive portion 610 may be coupled to the cavity wall 510 (shown in FIG. 5). The conductive portion 610 may interface with the seam 210.

The interconnects 600 may be coplanar with the second layer surface 220. For example, the conductive portion 610 may include an interconnect surface 620. The interconnect surface 620 may be coplanar with the second layer surface 220. The conductive portion 610 may have a variable thickness 630, and the variable thickness 630 of the conductive portion 610 may help facilitate making the interconnect surface 620 coplanar with the second layer surface 220.

Individual interconnects 600 may have differing thicknesses. For instance, the interconnect 600A may have a first thickness 640, and the interconnect 600B may have a second thickness 640. The thickness 640 may be different than (e.g., greater than) the thickness 650. The different thicknesses 640, 650 of the interconnects 600 may help facilitate making the interconnect surface 620 coplanar with the second layer surface 220.

In some examples interconnect surface 620 may not be coplanar with the second layer surface 220. For instance, the interconnect surface 620 may be located above the second layer surface 220, and the interconnects 600 may project from the second layer 200. The interconnect surface 620 may be located below the second layer surface 220, and the interconnects 600 may be recessed within the second layer 200.

The variable thickness 630 of the conductive portion, and the differing thicknesses 640, 650 of the interconnects 600 may help facilitate making the interconnect surfaces 220 coplanar. For example, the interconnect surface 220 of the first interconnect 600A may be coplanar with the interconnect surface 220 of the second interconnect 600B. Making the interconnect surfaces 220 of the interconnects 600 coplanar may help reduce relative interconnect thickness variations (e.g., where the interconnect surfaces 220 are not coplanar). Reducing relative interconnect thickness variations may help improve the coupling of the interconnects 600 with other components of an electronic device, for example a die or a motherboard. Accordingly, reducing relative interconnect thickness variations may help reduce the occurrence of electrical faults between the package 500 and the other components of the electronic device.

The package 500 may have the package thickness 420. The package thickness 420 may be the dimension between the first surface 120 of the first layer 110 and the interconnect surface 620 (e.g., if the interconnect surface 620 is coplanar with, or located above, the second layer surface 220 of the second layer 200). The package thickness 420 may be the dimension between the first surface 120 of the first layer 110 and the second layer surface 220 (e.g., if the interconnect surface 620 is coplanar with, or located below, the second layer surface 220).

Figure 7:
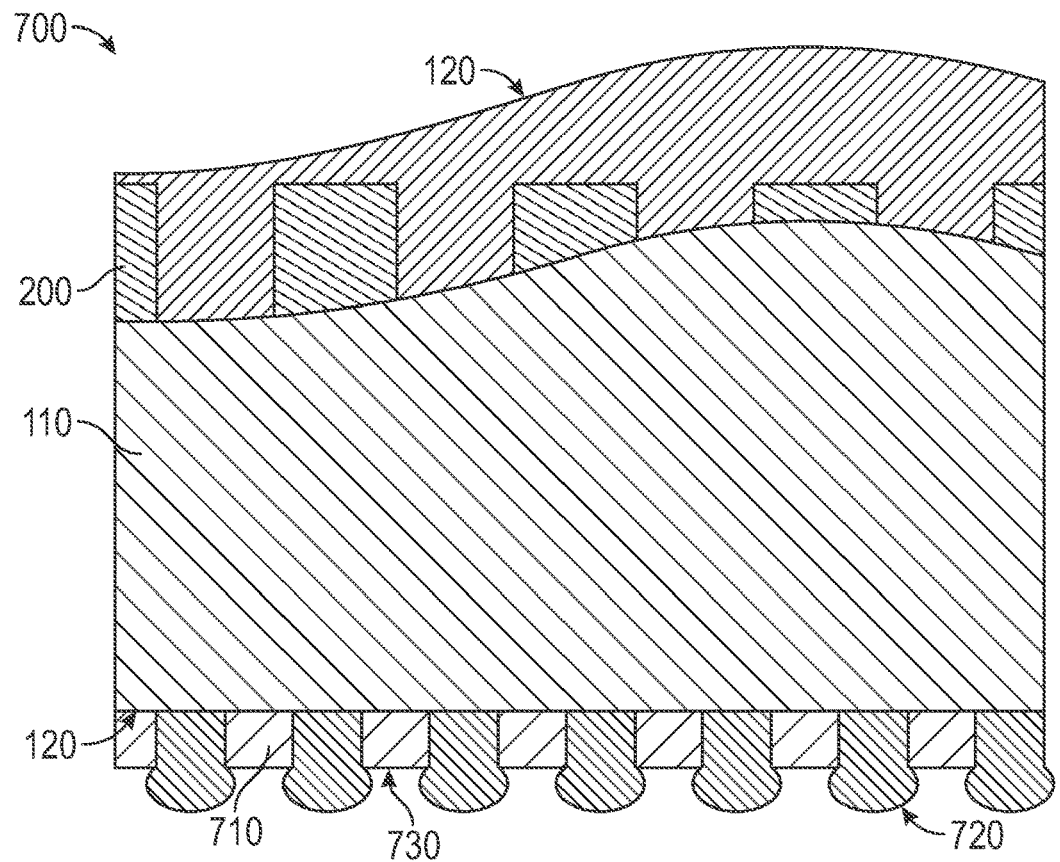
FIG. 7 shows an example of a portion of a third package during a manufacturing operation.

FIG. 7 shows an example of a portion of a third package 700 during a manufacturing operation. The package 700 may be similar to the package 500, or the package 100. For example, the package 700 may include the first layer 110 and the second layer 200. The package 700 may include a third layer 710. The third layer 710 may include a dielectric material. For example, the third layer 710 may include oxirane epoxy, phenolate esters, phenolic esters, acrylates, formaldehydes (e.g., novolaks, or the like), benzoquinones, diazoquinones, chalocogenides (e.g., Cadmium Selenide, Zinc Sulfide, Copper Sulfide, Zinc Selenide, Cadmium Sulfide, Aluminum Selenide, or the like), or the like (or combinations thereof).

The third layer 710 may be coupled to the first layer 110. For instance, the third layer 710 may be coupled to the first surface 120 of the first layer 110. The third layer 710 may be coupled to the second layer 200, for example the second layer surface 220. The package 700 may include additional layers, for instance the additional layers may include a dielectric material and electrical traces, or electrical components (e.g., passive components, for example resistors, capacitors, or the like).

As described herein, a surface (e.g., the second surface 120) of the package 700 may be made planar, and the thickness variation 160 (shown in FIG. 1) of the first layer 110 may be transferred (e.g., transposed, translated, relocated, or the like) to a different surface (e.g., the second surface layer 200) of the package 700. Accordingly, portions of the package 700 (e.g., the first layer 110, the seam 210, or the like) may have an undulating profile.

The package 700 may include a second set of interconnects 720. The second set of interconnects 720 may be included in the third layer 710 (or the first layer 110). The interconnects 720 may extend from the third layer 710. For example, the interconnects 720 may extend from a third layer surface 730. The interconnects 720 (or the third layer surface 730) may be made planar (e.g., with gravity, or applying a vacuum) and the thickness variation of the package 700 may be transferred to other portions of the package 700, for example the second layer surface 220.

Figure 8:
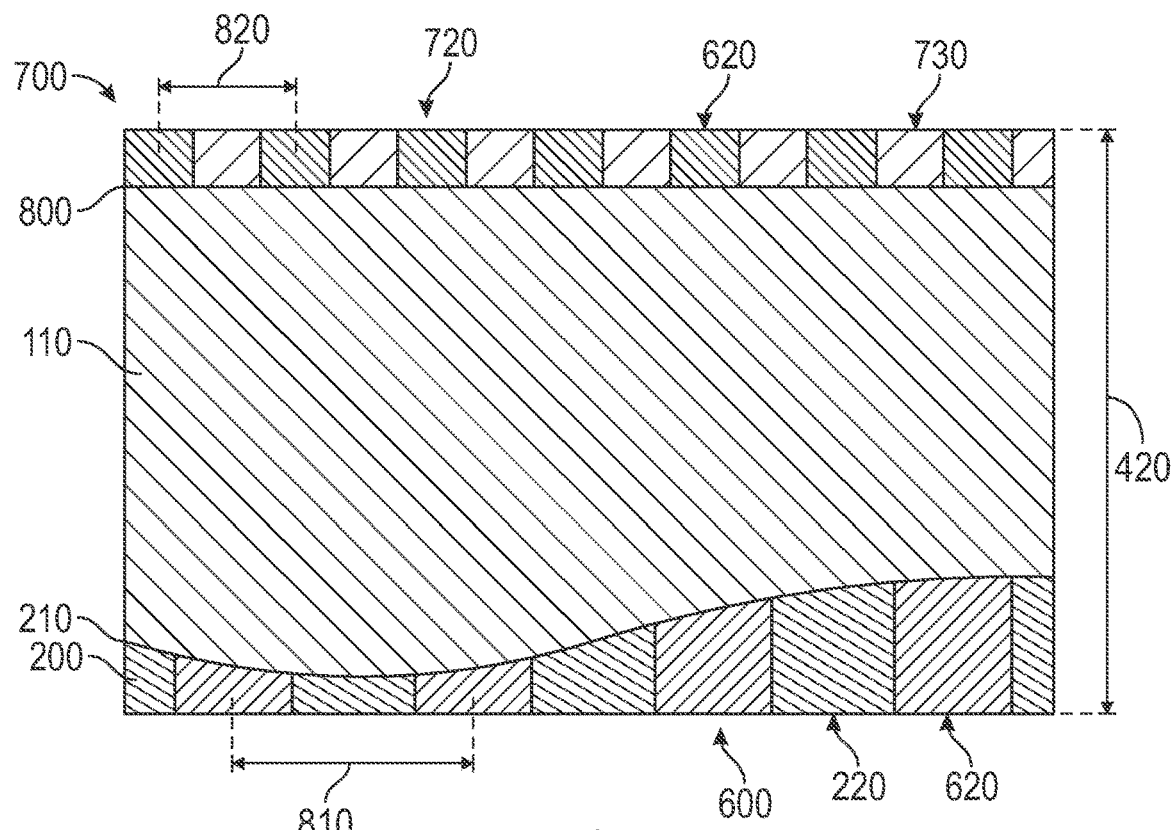
FIG. 8 shows the third package of FIG. 7 during a manufacturing operation.

FIG. 8 shows the third package 700 of FIG. 7 during a manufacturing operation. The second layer 200 may be coupled to the first layer 110, and the first seam 210 may have an undulating profile. The third layer 710 may be coupled to the first layer 110. A second seam 800 may be located at an interface of the first layer 110 and the third layer 710. The second seam 800 between the first layer 110 and the third layer 710 may be planar. The second seam 800 may be planar in comparison to the undulating profile of the first seam 210. For example, the second seam 800 may have a smaller undulating profile than the first seam 210 (e.g., the second seam 800 may within a range of approximately 10 nanometers to 5,000 nanometers, for example 10 nanometers to 50 nanometers).

Portions of the second set of interconnects 720 may be removed (e.g., planarized, ground, etched, ablated, or the like), for instance to make the interconnect surface 620 of the interconnects 720 coplanar with the third layer surface 730. The interconnect surface 620 may be located above, or located below, the third layer surface 730. The interconnect surface 620 of the second set of interconnects 720 may be parallel with the seam 800. The interconnect surface 620 of the first set of interconnects 600 may be parallel with the interconnect surface 620 of the second set of interconnects 720 (or parallel with the seam 800). Accordingly, the package thickness 420 may be consistent (e.g., constant, minimal variation, or the like), for example a variation in the package thickness 420 may be less than 50 nanometers.

The package thickness 420 may be the dimension between the interconnect surface 620 of the first set of interconnects 600 and the interconnect surface 620 of the second set of interconnects 720 (e.g., if the interconnect surface 620 is coplanar with, or located above, the second layer surface 220 or the third layer surface 730). The package thickness 420 may be the dimension between the second layer surface 220 and the third layer surface 730 (e.g., if the interconnect surface 620 is coplanar with, or located below, the second layer surface 220 or the third layer surface 730).

Figure 9:
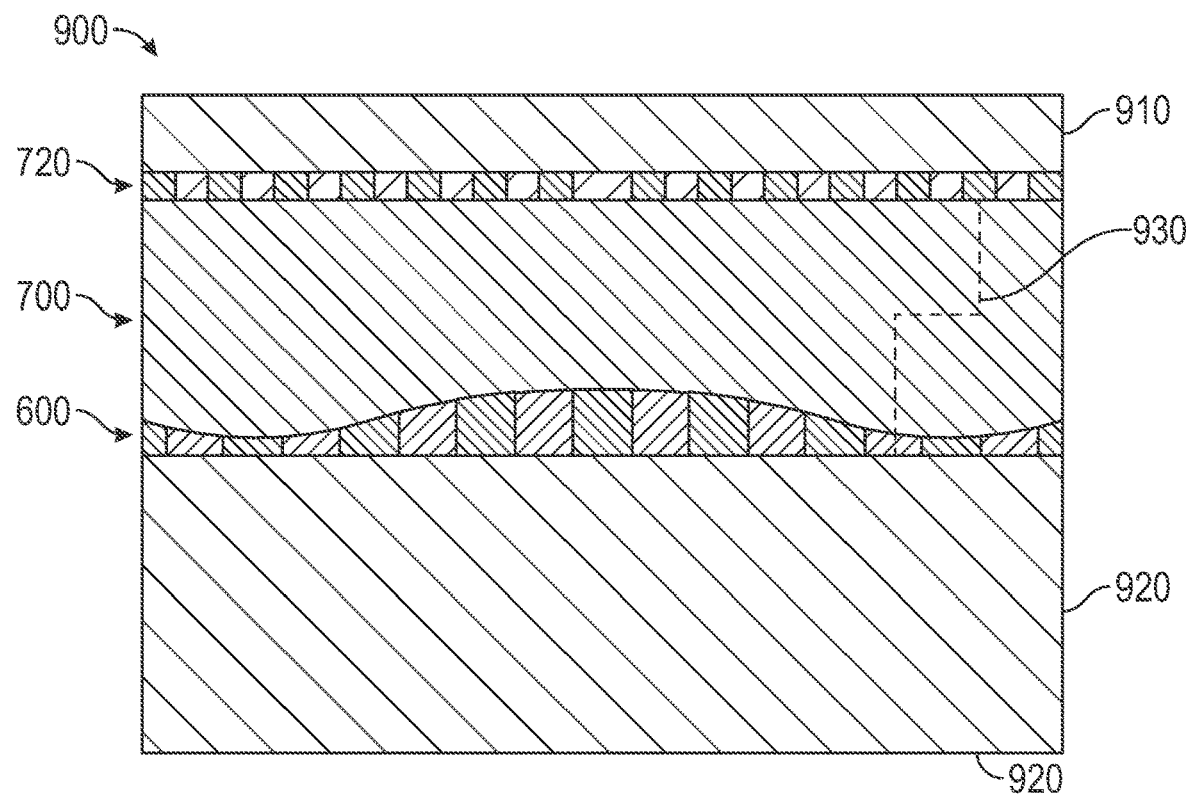
FIG. 9 shows an example of a portion of an electronic device.

FIG. 9 shows an example of a portion of an electronic device 900. The electronic device 900 may include the package 100 (shown in FIG. 4), the package 500 (shown in FIG. 6), or the package 700. The electronic device 900 may include a first electronic component 910 and may include a second electronic component 920. The electronic component 910 may include (but is not limited to) a die (e.g., a semiconductor die), a processor, memory (e.g., random access memory), graphics processing unit, ASIC, system on chip, silicon interposer, active interposer, transceiver tiles, or the like. The electronic component 920 may include (but is not limited to) a motherboard or the like. The electronic device may include a plurality of the electronic components 910, 920. The package 700 (or the package 100, or package 500) may be included for heterogeneous integration where silicon die (e.g., the component 910) are mounted on other silicon die (e.g., the component 920) to increase the performance of a microprocessor chipset (e.g., the electronic device 900).

The first electronic component 910 may be coupled to the package 700. For example, the electronic component 910 may be coupled to the second set of interconnects 720. The second electronic component 920 may be coupled to the package 700. For example, the electronic component e 920 may be coupled to the first set of interconnects 600.

The package 700 may include an electrical trace 930. The electrical trace 930 may be included in the package 100 (shown in FIG. 4) or the package 500 (shown in FIG. 6). The electrical trace 930 may help facilitate the transmission of an electrical signal within the package 700. For example, the electrical trace 930 may provide an electrical communication pathway (e.g., electrically interconnect) the first set of interconnects 600 with the second set of interconnects 720.

The package 700 may be configured to transmit an electrical signal between the electronic components 910, 920. For example, an electrical signal may be transmitted by the second electronic component 920 (e.g., a motherboard). The electrical signal may be transmitted into the first set of interconnects 600, the electrical trace 930, and the second set of interconnects 720 to the first electronic component 720.

The first set of interconnects 600 may be spaced at a first pitch 810. The second set of interconnects 720 may be spaced at a second pitch 820. The first pitch 810 may be greater than the second pitch. The interconnects 600 may be a first level interconnect, and the interconnects 720 may be a second level interconnect. The interconnects 600, 720 may be spaced at a variable pitch (e.g., a first subset of the interconnects 600 may be spaced at the first pitch 810, and a second subset of the interconnects 600 may be spaced at the second pitch 820).

Figure 10:
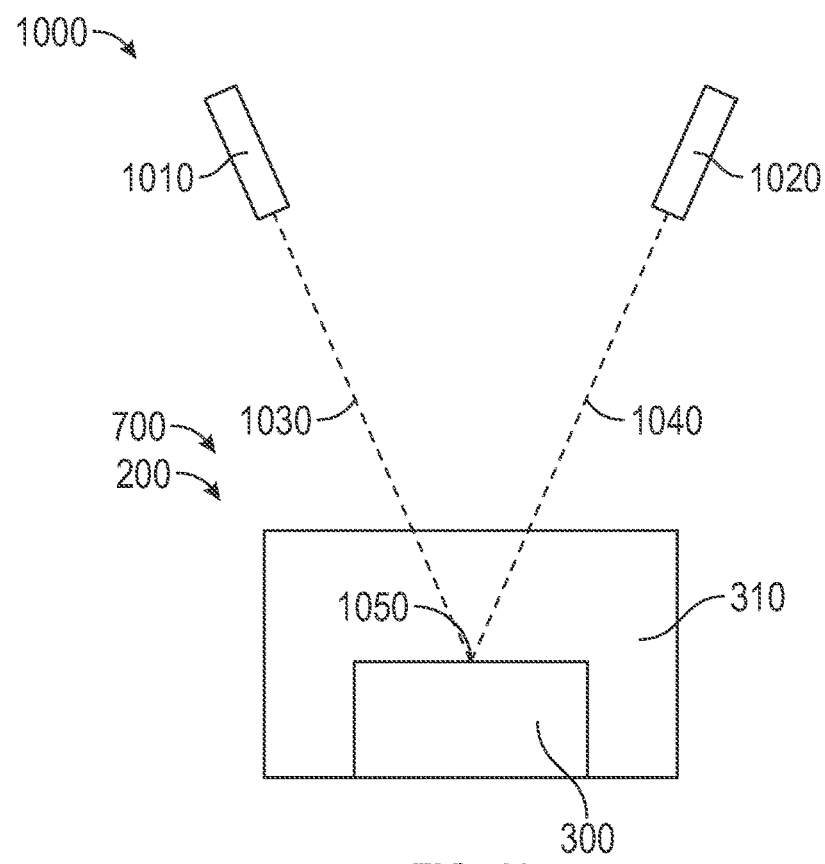
FIG. 10 shows a schematic diagram of a system for manufacturing an electronic device.

FIG. 10 shows a schematic diagram of a system 1000 for manufacturing an electronic device (e.g., the package 100, package 500, package 700, or the electronic device 900; shown respectively in FIG. 4, FIG. 6, FIG. 8, and FIG. 9). The system 1000 may include a first light source 1010 (e.g., a laser) and a second light source 1020. The light source 1010 may generate a first beam 1030, that includes one or more photons. The light source 1020 may generate a second beam 1040, that includes one or more photons.

As described herein, the second layer 220 may be exposed to a light source (e.g., the light sources 1010, 1020). For example, the second layer may be exposed to a single photon polymerization operation. For instance, the light source 1010 may cure (or solubilize) the second layer 200 (e.g., the second dielectric material) by supplying energy to the second layer 200. The energy supplied by the light source may exceed an activation energy threshold to cure (or solubilize) the second layer 200. Exposure of the second layer 200 to the light source may cure (or solubilize) the second layer 200 through the entire thickness of the second layer 200 (e.g., the light source 1010 may cure the second layer 200 from the second layer surface 220 to the second surface 130 of the first layer 110, shown in FIG. 3).

The second layer 220 may be exposed to a plurality of light sources. For example, the second layer 220 may be exposed to a multi-photon polymerization operation. The second layer 220 may be exposed to the first light source 1010 and the second light source 1020. The first beam 1030 and the second beam 1040 may coincide (e.g., converge, combine, or the like) at a voxel 1050 and the combined energy of the first beam 1030 and the second beam 1040 may exceed an activation energy threshold to cure (or solubilize) the second layer 200.

The multi-photon polymerization operation may increase the resolution of defining (e.g., patterning) the photo-exposed portions 300. For example, the photo-exposed portions 300 may be surrounded by (enclosed, encased, submerged within, or the like) the unexposed portions 310. The beams 1030, 1040 may be transmitted through the unexposed portions 310 and not exceed the activation energy threshold of the second layer 200. The beams 1030, 1040 may coincide at the voxel 1050, and the voxel 1050 may be located within the second layer 200. The combined energy of the beams 1030, 1040 at the voxel 1050 may exceed the activation energy threshold of the second layer 200. Accordingly, the second layer 200 may only be cured (or solubilize) at (or along) the voxel 1050, which may thereby improve resolution in defining the photo-exposed portion 300.

Figure 11:
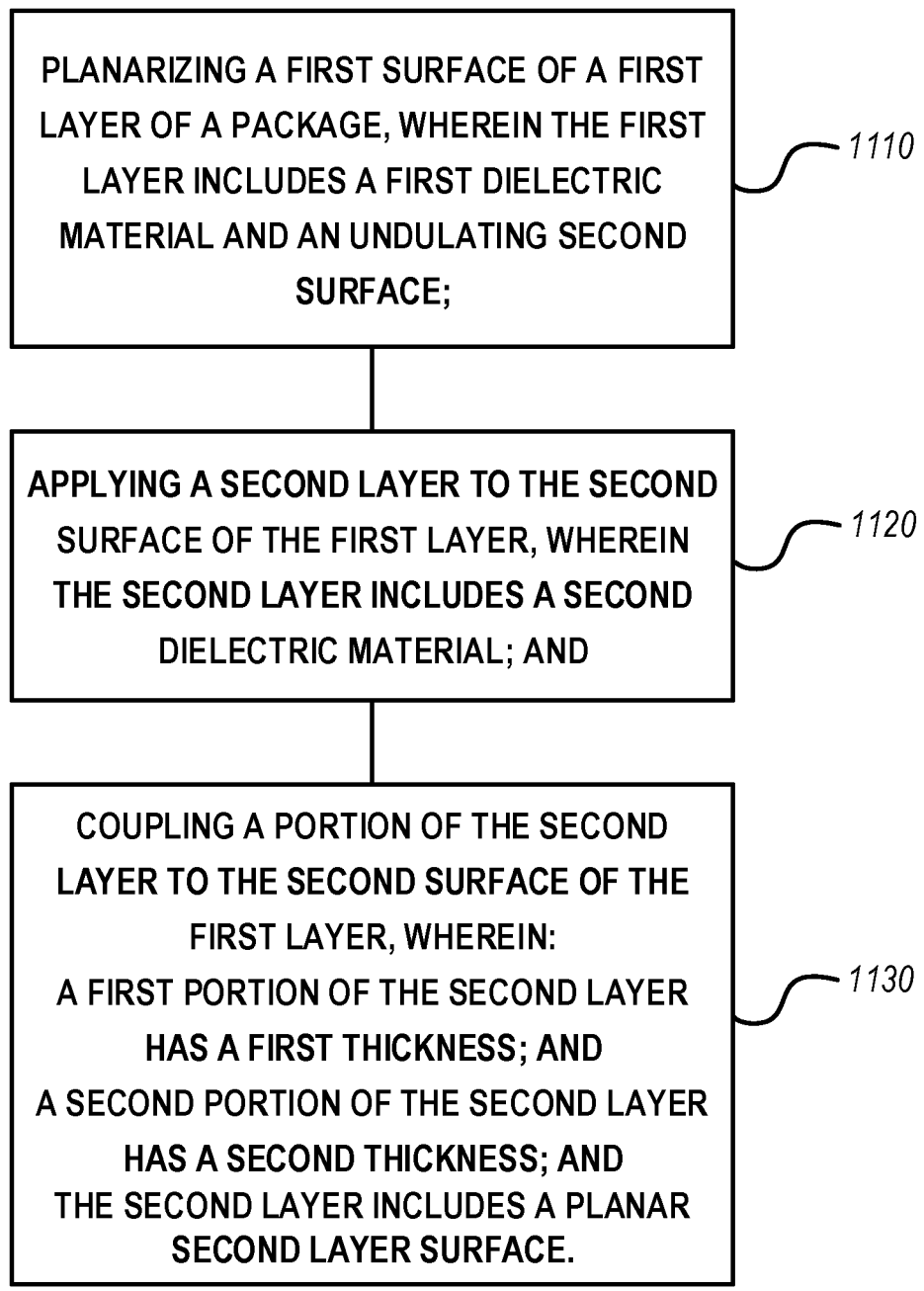
FIG. 11 shows one example of a method 1100 for manufacturing an electronic device.

FIG. 11 shows one example of a method 1100 for manufacturing an electronic device, including one or more of the package 100, the package 500, the package 700, the electronic device 900, or the system 1000 described herein. In describing the method 1100, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1100 include, but are not limited to, the corresponding numbered elements provided herein and other corresponding elements described herein (both numbered and unnumbered) as well as their equivalents.

At 1110, a first surface 120 of a first layer 110 of a package 100 may be planarized (e.g., flattened, smoothed, or the like). The first layer may include a first dielectric material and a second surface 130. The second surface 130 may undulate. The method 1100 may include at 1120 applying a second layer 200 to the second surface 130 of the first layer 110 (e.g., the second layer 200 may be placed into communication with the first layer 110). The second layer 200 may include a second dielectric material. At 1130 a portion of the second layer 200 may be coupled to the second surface 130 of the first layer. A first portion (e.g., the first section 520A, shown in FIG. 5) of the second layer 200 may have a first thickness (e.g., the first thickness 400, shown in FIG. 4). A second portion (e.g., the second section 520B, shown in FIG. 5) of the second layer 200 may have a second thickness (e.g., the second thickness 410, shown in FIG. 4). The second layer 200 may include a planar second layer surface 220.

Several options for the method 1100 follow. The first portion may have a first surface (e.g., the surface 330, shown in FIG. 3), and the second portion may have a second surface (e.g., the surface 330, shown in FIG. 3), and the first surface is coplanar with the second surface. A portion (e.g., the photo-exposed portion 300) of the second layer 200 may be exposed to a first light source 1010 and a second light source 1020. The portion may be exposed to additional light sources (e.g., a third light source). Exposing the portion of the second layer to the first light source and the second light source may decrease a solubility of the second layer 200 with respect to a developer (e.g., a solvent, an etchant, or the like). Exposing the portion of the second layer 200 to the first light source and the second light source may increase a solubility of the second layer 200 with respect to a developer.

A developer may be applied to the second layer 200. A third portion (e.g., the unexposed portion 310) of the second layer may be removed, for example by the developer. A conductive material (e.g., the conductive portion 610) may be located between the first portion of the second layer 200 and the second portion of the second layer 200.

Figure 12:
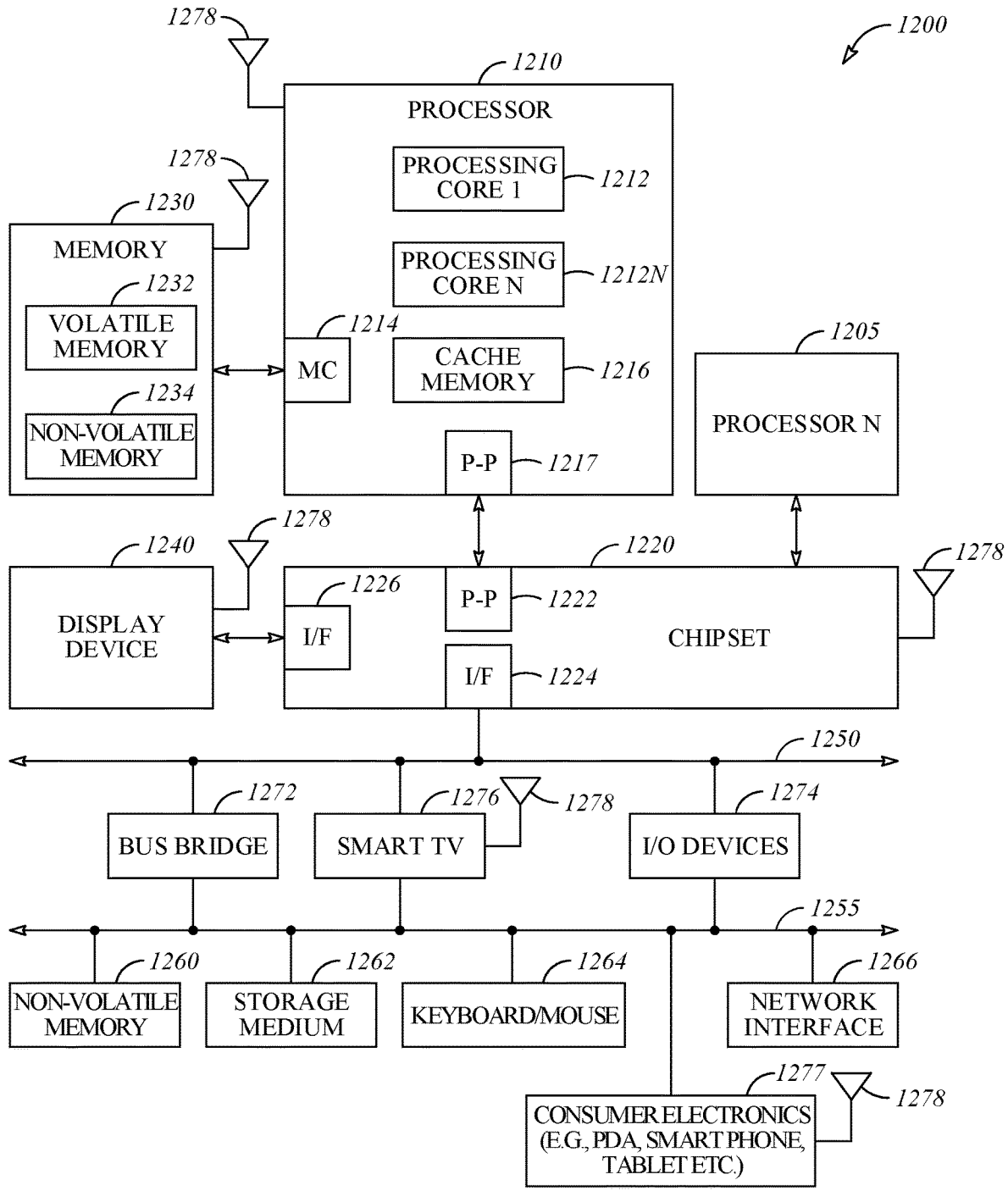
FIG. 12 illustrates a system level diagram, depicting an example of an electronic device.

FIG. 12 illustrates a system level diagram, depicting an example of an electronic device (e.g., system) including the package 100, package 500, package 700, or electronic device 900 as described in the present disclosure. FIG. 12 is included to show an example of a higher level device application for the package 100, package 500, package 700, or electronic device 900. In one embodiment, system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1200 is a system on a chip (SOC) system.

In one embodiment, processor 1210 has one or more processor cores 1212 and 1212N, where 1212N represents the Nth processor core inside processor 1210 where N is a positive integer. In one embodiment, system 1200 includes multiple processors including 1210 and 1205, where processor 1205 has logic similar or identical to the logic of processor 1210. In some embodiments, processing core 1212 includes, but is not limited to, pre-fetch logic to fetch instructions, decode logic to decode the instructions, execution logic to execute instructions and the like. In some embodiments, processor 1210 has a cache memory 1216 to cache instructions and/or data for system 1200. Cache memory 1216 may be organized into a hierarchal structure including one or more levels of cache memory.

In some embodiments, processor 1210 includes a memory controller 1214, which is operable to perform functions that enable the processor 1210 to access and communicate with memory 1230 that includes a volatile memory 1232 and/or a non-volatile memory 1234. In some embodiments, processor 1210 is coupled with memory 1230 and chipset 1220. Processor 1210 may also be coupled to a wireless antenna 1278 to communicate with any device configured to transmit and/or receive wireless signals. In one embodiment, an interface for wireless antenna 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1234 includes, but is not limited to, flash memory, phase change memory (PCM), read-only memory (ROM), electrically erasable programmable read-only memory (EEPROM), or any other type of non-volatile memory device.

Memory 1230 stores information and instructions to be executed by processor 1210. In one embodiment, memory 1230 may also store temporary variables or other intermediate information while processor 1210 is executing instructions. In the illustrated embodiment, chipset 1220 connects with processor 1210 via Point-to-Point (PtP or P-P) interfaces 1217 and 1222. Chipset 1220 enables processor 1210 to connect to other elements in system 1200. In some embodiments of the example system, interfaces 1217 and 1222 operate in accordance with a PtP communication protocol such as the Intel® QuickPath Interconnect (QPI) or the like. In other embodiments, a different interconnect may be used.

In some embodiments, chipset 1220 is operable to communicate with processor 1210, 1205N, display device 1240, and other devices, including a bus bridge 1272, a smart TV 1276, I/O devices 1274, nonvolatile memory 1260, a storage medium (such as one or more mass storage devices 1262, a keyboard/mouse 1264, a network interface 1266, and various forms of consumer electronics 1277 (such as a PDA, smart phone, tablet etc.), etc. In one embodiment, chipset 1220 couples with these devices through an interface 1224. Chipset 1220 may also be coupled to a wireless antenna 1278 to communicate with any device configured to transmit and/or receive wireless signals.

Chipset 1220 connects to display device 1240 via interface 1226. Display 1240 may be, for example, a liquid crystal display (LCD), a plasma display, cathode ray tube (CRT) display, or any other form of visual display device. In some embodiments of the example system, processor 1210 and chipset 1220 are merged into a single SOC. In addition, chipset 1220 connects to one or more buses 1250 and 1255 that interconnect various system elements, such as I/O devices 1274, nonvolatile memory 1260, storage medium

1262, a keyboard/mouse 1264, and network interface 1266. Buses 1250 and 1255 may be interconnected together via a bus bridge 1272.

In one embodiment, mass storage device 1262 includes, but is not limited to, a solid state drive, a hard disk drive, a universal serial bus flash memory drive, or any other form of computer data storage medium. In one embodiment, network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) may be incorporated into processor core 1212.

VARIOUS NOTES & ASPECTS

Aspect 1 may include or use subject matter (such as an apparatus, a system, a device, a method, a means for performing acts, or a device readable medium including instructions that, when performed by the device, may cause the device to perform acts), such as may include or use a package for an electronic device, comprising: a first layer including a first dielectric material and having a planar first surface, wherein the first layer has a variable thickness; a second layer including a second dielectric material and having a planar second surface, wherein the second layer is coupled to the first layer and has a variable thickness; a seam located at the interface between the first layer and the second layer, wherein the seam has an undulating profile; and at least one electrical trace located in the first layer or the second layer.

Aspect 2 may include or use, or may optionally be combined with the subject matter of Aspect 1, to optionally include or use a third layer having a planar third surface and including a first set of interconnects and a third dielectric material, wherein the third layer is coupled to the first layer.

Aspect 3 may include or use, or may optionally be combined with the subject matter of one or any combination of Aspects 1 or 2 to optionally include or use a first set of interconnects included in the second layer, wherein the first set of interconnects includes a first interconnect having a first height and a second interconnect having a second height.

Aspect 4 may include or use, or may optionally be combined with the subject matter of Aspect 3 to optionally include or use wherein the second set of interconnects is coplanar with the second surface.

Aspect 5 may include or use, or may optionally be combined with the subject matter of one or any combination of Aspects 1 through 4 to optionally include or use a third layer having a planar third surface and including a first set of interconnects and a third dielectric material, wherein the third layer is coupled to the first layer; a second set of interconnects included in the second layer, wherein the second set of interconnects includes a first interconnect having a first height and a second interconnect having a second height; and wherein the first set of interconnects are spaced at a first pitch and the second set of interconnects are spaced at a second pitch.

Aspect 6 may include or use, or may optionally be combined with the subject matter of Aspect 5 to optionally include or use wherein the first pitch is greater than the second pitch.

Aspect 7 may include or use, or may optionally be combined with the subject matter of one or any combination of Aspects 5 or 6 to optionally include or use wherein at least one interconnect of the first set of interconnects is in electrical communication with the first interconnect or the second interconnect through the electrical trace.

Aspect 8 may include or use, or may optionally be combined with the subject matter of one or any combination of Aspects 5 through 7 to optionally include or use wherein the second set of interconnects includes a first interconnect having a first height and a second interconnect having a second height.

Aspect 9 may include or use, or may optionally be combined with the subject matter of one or any combination of Aspects 1 through 8 to optionally include or use wherein the second dielectric material includes a negative photoresist or a positive photoresist.

Aspect 10 may include or use, or may optionally be combined with the subject matter of one or any combination of Aspects 1 through 9 to optionally include or use wherein the second dielectric material includes an organically modified ceramic.

Aspect 11 may include or use, or may optionally be combined with the subject matter of one or any combination of Aspects 1 through 10 to optionally include or use wherein first layer has a maximum thickness and a minimum thickness, and the difference between the maximum thickness and the minimum thickness is within a range of approximately 50 nanometers to 1 millimeter.

Aspect 12 may include or use, or may optionally be combined with the subject matter of one or any combination of Aspects 1 through 11 to optionally include or use wherein first layer has a maximum thickness and a minimum thickness, and the difference between the maximum thickness and the minimum thickness is within a range of approximately 0.0001% to 5% of a layer thickness of the first layer.

Aspect 13 may include or use subject matter (such as an apparatus, a system, a device, a method, a means for performing acts, or a device readable medium including instructions that, when performed by the device, may cause the device to perform acts), such as may include or use an electronic device, comprising: a package, including: a first layer including a first dielectric material and having a planar first surface, wherein the first layer has a variable thickness; a second layer including a second dielectric material and having a planar second surface, wherein the second layer is coupled to the first layer and has a variable thickness; a seam located at the interface between the first layer and the second layer, wherein the seam has an undulating profile; and at least one electrical trace located in the first layer or the second layer; and a semiconductor die coupled with the package, wherein the semiconductor die is in electrical communication with the package.

Aspect 14 may include or use, or may optionally be combined with the subject matter of Aspect 13, to optionally include or use a motherboard, wherein the package is in electrical communication with the motherboard, and the package is located between the motherboard and the semiconductor die.

Aspect 15 may include or use, or may optionally be combined with the subject matter of one or any combination of Aspects 13 or 14 to optionally include or use wherein the semiconductor die is configured as a processor die, a memory die, a graphics processing unit, or an ASIC die.

Aspect 16 may include or use subject matter (such as an apparatus, a system, a device, a method, a means for performing acts, or a device readable medium including instructions that, when performed by the device, may cause the device to perform acts), such as may include or use a method for manufacturing an electronic device, comprising: planarizing a first surface of a first layer of a package, wherein the first layer includes a first dielectric material and an undulating second surface; applying a second layer to the second surface of the first layer, wherein the second layer includes a second dielectric material; and coupling a portion of the second layer to the second surface of the first layer, wherein: a first portion of the second layer has a first thickness; and a second portion of the second layer has a second thickness; and the second layer includes a planar second layer surface.

Aspect 17 may include or use, or may optionally be combined with the subject matter of Aspect 16, to optionally include or use wherein the first portion has a first surface, and the second portion has a second surface, and the first surface is coplanar with the second surface.

Aspect 18 may include or use, or may optionally be combined with the subject matter of one or any combination of Aspects 16 or 17 to optionally include or use exposing at least a portion of the second layer to a first light source and a second light source.

Aspect 19 may include or use, or may optionally be combined with the subject matter of Aspect 18 to optionally include or use wherein the exposing the portion of the second layer to the first light source and the second light source decreases a solubility of the second layer with respect to a developer.

Aspect 20 may include or use, or may optionally be combined with the subject matter of one or any combination of Aspects 18 to optionally include or use wherein the exposing the portion of the second layer to the first light source and the second light source increases a solubility of the second layer with respect to a developer.

Aspect 21 may include or use, or may optionally be combined with the subject matter of one or any combination of Aspects 16 through 20 to optionally include or use applying a developer to the second layer; and removing a third portion of the second layer.

Aspect 22 may include or use, or may optionally be combined with the subject matter of one or any combination of Aspects 16 through 21 to optionally include or use locating a conductive material between the first portion of the second layer and the second portion of the second layer.

Aspect 23 may include or use, or may optionally be combined with any portion or combination of any portions of any one or more of Aspects 1 through 22 to include or use, subject matter that may include means for performing any one or more of the functions of Aspects 1 through 22, or a machine-readable medium including instructions that, when performed by a machine, cause the machine to perform any one or more of the functions of Aspects 1 through 22.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by The claimed invention is:

1. A package for an electronic device, comprising:
   a first layer including a first dielectric material and having a planar first surface, wherein the first layer has a variable thickness;
   a second layer including a second dielectric material and having a planar second surface, wherein the second layer is coupled to the first layer and has a variable thickness;
   a seam located at the interface between the first layer and the second layer, wherein the seam has an undulating profile;
   at least one electrical trace located in the first layer or the second layer; and
   a third layer having a planar third surface and including a first set of interconnects and a third dielectric material, wherein the third layer is coupled to the first layer.

2. The package of claim 1, further comprising a second set of interconnects included in the second layer, wherein the second set of interconnects includes a first interconnect having a first height and a second interconnect having a second height.

3. The package of claim 2, wherein the second set of interconnects are coplanar with the second surface.

4. The package of claim 2,
   wherein the first set of interconnects are spaced at a first pitch and the second set of interconnects are spaced at a second pitch.

5. The package of claim 4, wherein the first pitch is greater than the second pitch.

6. The package of claim 2, wherein at least one interconnect of the first set of interconnects is in electrical communication with the first interconnect or the second interconnect through the electrical trace.

7. The package of claim 2, wherein the first set of interconnects includes a third interconnect having a third height and a fourth interconnect having a fourth height.

8. The package of claim 1, wherein the second dielectric material includes a negative photoresist or a positive photoresist.

9. The package of claim 1, wherein the second dielectric material includes an organically modified ceramic.

10. The package of claim 1, wherein first layer has a maximum thickness and a minimum thickness, and the difference between the maximum thickness and the minimum thickness is within a range of approximately 50 nanometers to 1 millimeter.

11. The package of claim 1, wherein first layer has a maximum thickness and a minimum thickness, and the difference between the maximum thickness and the minimum thickness is within a range of approximately 0.0001% to 5% of a layer thickness of the first layer.

12. An electronic device, comprising:
   a package, including:
      a first layer including a first dielectric material and having a planar first surface, wherein the first layer has a variable thickness;
      a second layer including a second dielectric material and having a planar second surface, wherein the second layer is coupled to the first layer and has a variable thickness;
      a seam located at the interface between the first layer and the second layer, wherein the seam has an undulating profile;
      a first set of interconnects included in the second layer, wherein the first set of interconnects includes a first interconnect having a first height and a second interconnect having a second height; and
      at least one electrical trace located in the first layer or the second layer; and
   a semiconductor die coupled with the package, wherein the semiconductor die is in electrical communication with the package.

13. The electronic device of claim 12, further comprising a motherboard, wherein the package is in electrical communication with the motherboard, and the package is located between the motherboard and the semiconductor die.

14. The electronic device of claim 12, wherein the semiconductor die is configured as a processor die, a memory die, a graphics processing unit, or an ASIC die.

15. The package of claim 12, further comprising a third layer having a planar third surface, wherein the third layer is coupled to the first layer.

16. The package of claim 15, wherein the third layer includes a third dielectric material.

17. The package of claim 12, wherein the second set of interconnects are coplanar with the second surface.

18. The package of claim 12, wherein first layer has a maximum thickness and a minimum thickness, and the difference between the maximum thickness and the minimum thickness is within a range of approximately 0.0001% to 5% of a layer thickness of the first layer.

19. A package for an electronic device, comprising:
   a first layer including a first dielectric material and having a planar first surface, wherein the first layer has a variable thickness;
   a second layer including a second dielectric material and having a planar second surface, wherein the second layer is coupled to the first layer and has a variable thickness;
   a seam located at the interface between the first layer and the second layer, wherein the seam has an undulating profile;
   a first set of interconnects included in the second layer, wherein the first set of interconnects includes a first interconnect having a first height and a second interconnect having a second height; and
   at least one electrical trace located in the first layer or the second layer.

20. The package of claim 19, further comprising a third layer having a planar third surface, wherein the third layer is coupled to the first layer.

21. The package of claim 20, wherein the third layer includes a third dielectric material.

22. The package of claim 19, wherein the second set of interconnects are coplanar with the second surface.

\* \* \* \* \*